US012658230B2

(12) United States Patent
Kim et al.

(10) Patent No.: US 12,658,230 B2
(45) Date of Patent: Jun. 16, 2026

(54) MEMORY DEVICE, METHOD OF OPERATING THE MEMORY DEVICE, AND MEMORY SYSTEM

(71) Applicant: SAMSUNG ELECTRONICS CO., LTD., Suwon-si (KR)

(72) Inventors: Tongsung Kim, Suwon-si (KR); Woojung Kim, Suwon-si (KR); Seonkyoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 18/791,722

(22) Filed: Aug. 1, 2024

(65) Prior Publication Data

US 2025/0078888 A1     Mar. 6, 2025

(30) Foreign Application Priority Data

Sep. 6, 2023     (KR) ......................... 10-2023-0118548

(51) Int. Cl.
*G11C 7/22*     (2006.01)
*G11C 7/10*     (2006.01)
(52) U.S. Cl.
CPC ............ *G11C 7/222* (2013.01); *G11C 7/1093* (2013.01); *G11C 7/10* (2013.01); *G11C 2207/2254* (2013.01)
(58) Field of Classification Search
CPC ... G11C 7/1063; G11C 7/1045; G11C 7/1069; G11C 7/1096; G11C 7/14; H03K 19/0185; H04L 25/0246; G06F 1/04; G01R 31/3004
See application file for complete search history.

(56) References Cited

U.S. PATENT DOCUMENTS

| | | | | |
|---|---|---|---|---|
| 7,519,130 B2 * | 4/2009 | Hsu | ...................... | H04L 25/0274 |
| | | | | 327/107 |
| 7,924,046 B1 * | 4/2011 | Ding | ................... | H04L 25/0286 |
| | | | | 326/26 |
| 7,936,812 B2 * | 5/2011 | Hollis | ............... | H04L 25/03057 |
| | | | | 375/233 |
| 8,091,008 B2 * | 1/2012 | Oku | ........................ | G11C 7/106 |
| | | | | 714/766 |
| 8,112,680 B2 * | 2/2012 | Chung | ................. | G11C 7/1006 |
| | | | | 714/701 |

(Continued)

FOREIGN PATENT DOCUMENTS

| | | |
|---|---|---|
| KR | 10-2014-0113105 | 9/2014 |
| KR | 10-2022-0153964 | 11/2022 |

*Primary Examiner* — Jason Lappas
(74) *Attorney, Agent, or Firm* — Fish & Richardson P.C.

(57)     ABSTRACT

A memory device correcting a data strobe signal when performing a write operation includes a correction circuit configured to receive the data strobe signal and to generate a reference delay for the received data strobe signal, and a main circuit configured to correct the data strobe signal based on the reference delay generated by the correction circuit. The correction circuit includes a delay cell configured to generate a reference delay for the data strobe signal received by the main circuit and to store the generated reference delay, when a data signal is input to the main circuit, a first counter configured to adjust the reference delay, and a second counter configured to determine a delay of the data strobe signal received by the main circuit, when a write operation is performed.

20 Claims, 11 Drawing Sheets

(56) References Cited

U.S. PATENT DOCUMENTS

| | | | | |
|---|---|---|---|---|
| 8,385,492 | B2 * | 2/2013 | Ho | H04B 17/295 |
| | | | | 375/340 |
| 8,624,653 | B2 * | 1/2014 | Nagda | G01R 31/31703 |
| | | | | 327/307 |
| 9,147,452 | B2 | 9/2015 | Na | |
| 9,565,036 | B2 | 2/2017 | Zerbe et al. | |
| 9,658,642 | B2 | 5/2017 | Mozak | |
| 10,347,358 | B2 * | 7/2019 | Kim | G11C 29/022 |
| 10,523,204 | B2 * | 12/2019 | Koo | G11C 7/10 |
| 11,804,841 | B2 | 10/2023 | Choi et al. | |
| 2007/0176659 | A1 | 8/2007 | Gomm | |
| 2016/0034014 | A1 | 2/2016 | Turullols et al. | |
| 2020/0058332 | A1 * | 2/2020 | Choi | G11C 8/06 |
| 2020/0125505 | A1 * | 4/2020 | Brox | G11C 7/1084 |
| 2022/0191069 | A1 * | 6/2022 | Dong | H04L 25/0272 |

* cited by examiner

MEMORY DEVICE, METHOD OF OPERATING THE MEMORY DEVICE, AND MEMORY SYSTEM

CROSS-REFERENCE TO RELATED APPLICATION

This application claims priority under 35 U.S.C. § 119 to Korean Patent Application No. 10-2023-0118548, filed in the Korean Intellectual Property Office on Sep. 6, 2023, the disclosure of which is incorporated by reference herein in its entirety.

BACKGROUND

When a write operation is performed by a memory device, a delay that may occur in a data strobe signal (DQS) should be corrected. In order to correct the delay in the data strobe signal, a conventional memory device uses a method of applying a voltage higher than a voltage applied from an external power source to an internal circuit. However, the delay correction method of the data strobe signal (DQS) of the conventional memory device has a disadvantage of consuming a lot of power because an internal power source with a high voltage is be generated.

SUMMARY

In general, in some aspects, the present disclosure is directed toward a memory device in which power required for correcting a data strobe signal is reduced.

According to some aspects of the present disclosure, a memory device includes correcting a data strobe signal when performing a write operation, including a correction circuit configured to receive the data strobe signal and to generate a reference delay for the received data strobe signal, and a main circuit configured to correct the data strobe signal based on the reference delay generated by the correction circuit. The correction circuit includes a delay cell configured to generate a reference delay for the data strobe signal received by the main circuit and to store the generated reference delay when a data signal is input to the main circuit, a first counter configured to adjust the reference delay, and a second counter configured to determine a delay of the data strobe signal received by the main circuit, when a write operation is performed.

According to some aspects of the present disclosure, a method of operating a memory device includes correcting a data strobe signal when performing a write operation, the method including, by a correction circuit, receiving the data strobe signal and generating a reference delay for the received data strobe signal, and correcting, by the correction circuit, the data strobe signal based on the reference delay generated by a main circuit. The generating of the reference delay for the received data strobe signal further includes generating a reference delay for the data strobe signal received by the main circuit and storing the generated reference delay, when a data signal is input to the main circuit, adjusting the reference delay, and determining a delay of a data strobe signal received by a main circuit, when a write operation is performed.

According to some aspects of the present disclosure, a memory system includes a memory device that corrects a data strobe signal when performing a write operation, including a correction circuit configured to receive the data strobe signal from a memory controller and to generate a reference delay for the received data strobe signal, and a main circuit configured to correct the data strobe signal based on the reference delay generated by the correction circuit. The correction circuit includes a delay cell configured to generate a reference delay for the data strobe signal received by the main circuit and to store the generated reference delay, when a write training operation on the main circuit is performed, a first counter configured to adjust the reference delay, and a second counter configured to determine a delay of the data strobe signal received by the main circuit, when a write operation is performed.

BRIEF DESCRIPTION OF THE DRAWINGS

Exemplary implementations will be more clearly understood from the following detailed description, taken in conjunction with the accompanying drawings.

DETAILED DESCRIPTION

Hereinafter, exemplary implementations will be described in detail with reference to the accompanying drawings.

Figure 1:
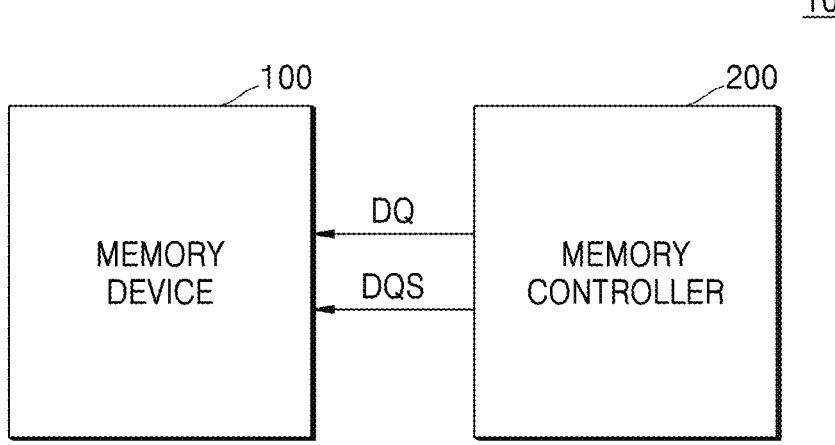
FIG. 1 is a block diagram of an example of a memory system according to some implementations.

FIG. 1 is a block diagram of an example of a memory system 10 according to some implementations. In FIG. 1, the memory system 10 may include a memory device 100 and a memory controller 200.

The memory device 100 may receive a data signal DQ and a data strobe signal DQS from the memory controller 200 and may generate a reference delay for the received data strobe signal DQS. In addition, the memory device 100 may correct the data strobe signal DQS based on the generated reference delay. For example, the memory device 100 may correct the data strobe signal DQS in advance when performing a write training operation before performing a write operation, and may perform the write operation without generating an error. The memory device 100 may include a volatile memory or a non-volatile memory.

When the write training operation is performed, the memory device 100 may generate the reference delay for the data strobe signal DQS and may store the generated reference delay. For example, the memory device 100 may adjust and store the reference delay. In addition, when the write operation is performed, the memory device 100 determines a delay of the data strobe signal DQS, and when it is determined that a delay occurs in the data strobe signal DQS when the write operation is actually performed, the delay occurring when performing the write operation may be corrected based on the stored reference delay.

The memory controller 200 may generate the data signal DQ and the data strobe signal DQS, and may transmit the generated data signal DQ and data strobe signal DQS to the memory device 100. The memory controller 200 may have the memory device 100 perform the write training operation before the write operation is performed by the memory device 100. For example, the memory controller 200 may transmit a write training command to the memory device 100 and may have the memory device 100 determine the delay of the data strobe signal DQS to have the memory device 100 perform the write training operation.

Figure 2:
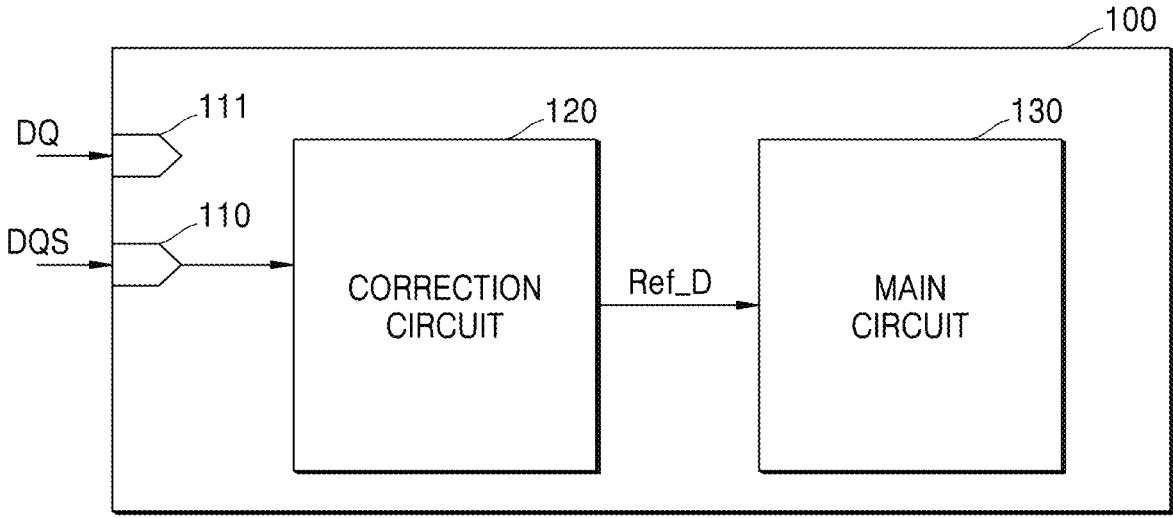
FIG. 2 is a block diagram of an example of a memory device according to some implementations.

FIG. 2 is a block diagram of an example of a memory device 100 according to some implementations. In FIG. 2, the memory device 100 may include a first pad 110, a second pad 111, a correction circuit 120, and a main circuit 130.

The first pad 110 may receive the data strobe signal DQS. For example, the first pad 110 may receive the data strobe signal DQS generated by the memory controller 200 of FIG. 1 and may transmit the received data strobe signal DQS to the correction circuit 120.

The second pad 111 may receive the data signal DQ. For example, the second pad 111 may receive the data signal DQ generated by the memory controller 200 of FIG. 1 and may perform the write operation based on the received data signal DQ.

The correction circuit 120 may receive the data strobe signal DQS and may generate the reference delay Ref_D for the received data strobe signal DQS. For example, the correction circuit 120 may receive the data strobe signal DQS from the memory controller 200 of FIG. 1 and may generate the reference delay Ref_D during the write training operation. A configuration of the correction circuit 120 will be described in detail with reference to FIGS. 3 and 4.

The main circuit 130 may correct the data strobe signal DQS based on the reference delay Ref_D generated by the correction circuit 120. For example, when the memory device 100 performs the write operation, the main circuit 130 may receive the reference delay Ref_D from the correction circuit 120 and may correct the delay of the data strobe signal DQS based on the received reference delay Ref_D. A configuration of the main circuit 130 will be described in detail with reference to FIGS. 3 and 6.

Figure 3:
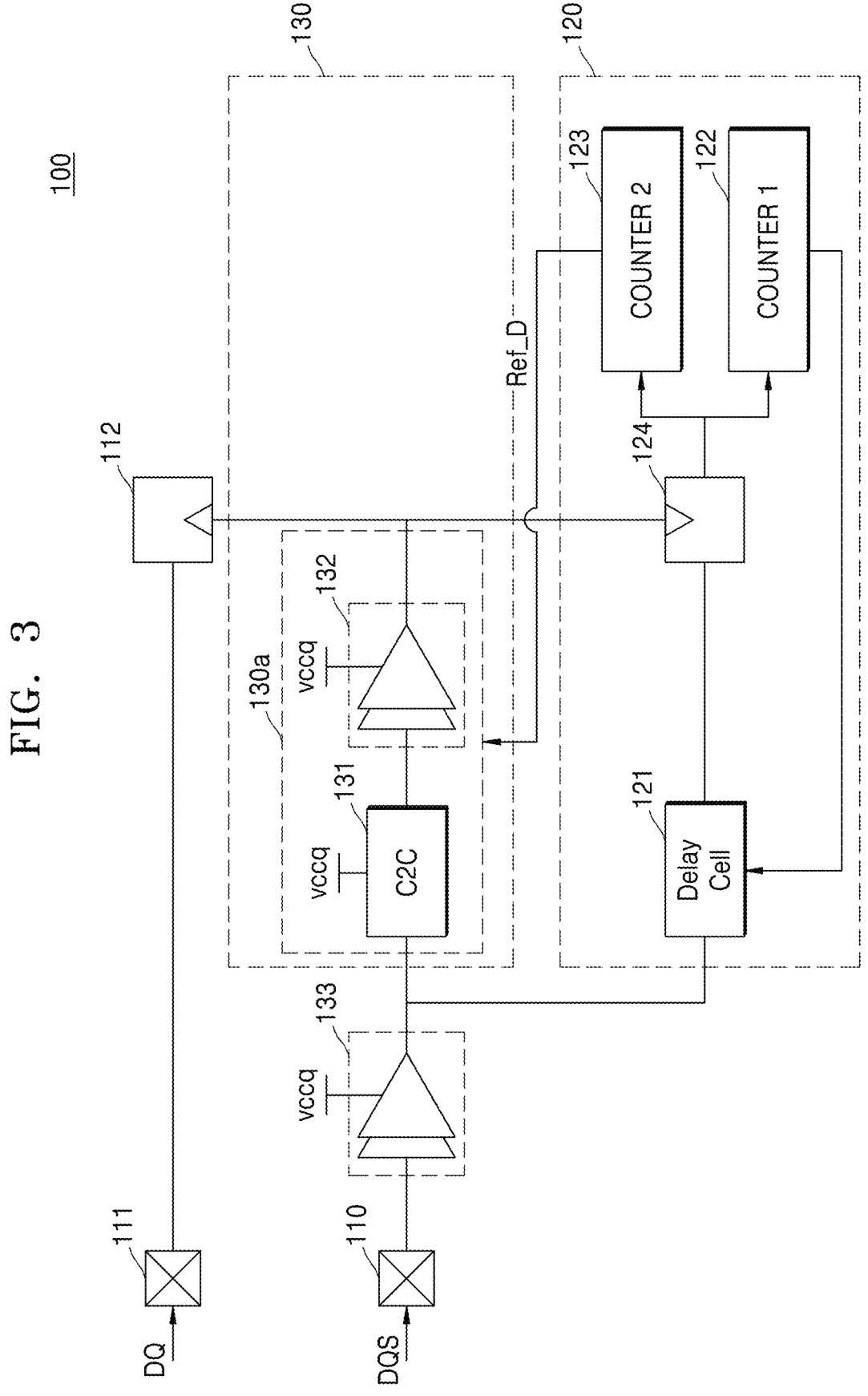
FIG. 3 is a circuit diagram of an example of a memory device according to some implementations.

FIG. 3 is a circuit diagram of an example of a memory device 100 according to some implementations. In FIG. 3, the memory device 100 may include a first pad 110, a second pad 111, a first logic circuit 112, a correction circuit 120, and a main circuit 130.

As described with respect to FIG. 2, the first pad 110 may receive the data strobe signal DQS, and the second pad 111 may receive the data signal DQ. The first logic circuit 112 may transmit the data signal DQ received when performing the write operation to the correction circuit 120 so that the write operation is performed.

The correction circuit 120 may include a delay cell 121, a first counter 122, a second counter 123, and a second logic circuit 124. In addition, the main circuit 130 may include a current mode logic-complementary metal oxide semiconductor (CMOS) level converter 131 (a current mode logic (CML) to CMOS chip-to-chip (C2C) delay controller), and a delay corrector 132 and may be connected to the data strobe signal corrector 133.

Components of the main circuit 130 may use an external voltage vccq. For example, the current mode logic-CMOS level converter 131, the delay corrector 132, and the data strobe signal corrector 133 may use the external voltage vccq. The current mode logic-CMOS level converter (C2C delay controller) 131 and the delay corrector 132 may constitute a main circuit delay cell 130a. Because the components of the main circuit 130 use the external voltage vccq, the memory device 100 may reduce the delay of the data strobe signal DQS caused by an internal power source. Components of the correction circuit 120 will be described in detail in FIG. 4, and components of the main circuit 130 will be described in detail in FIG. 6.

The correction circuit 120 may generate the reference delay Ref_D when performing the write training operation and may store the generated reference delay Ref_D in the delay cell 121. The second counter 123 of the correction circuit 120 may operate when the main circuit 130 is activated. For example, the second counter 123 may transmit the reference delay Ref_D to the C2C delay controller 131 of the main circuit 130 and may correct the delay of the data strobe signal DQS received when the write operation is performed.

Figure 4:
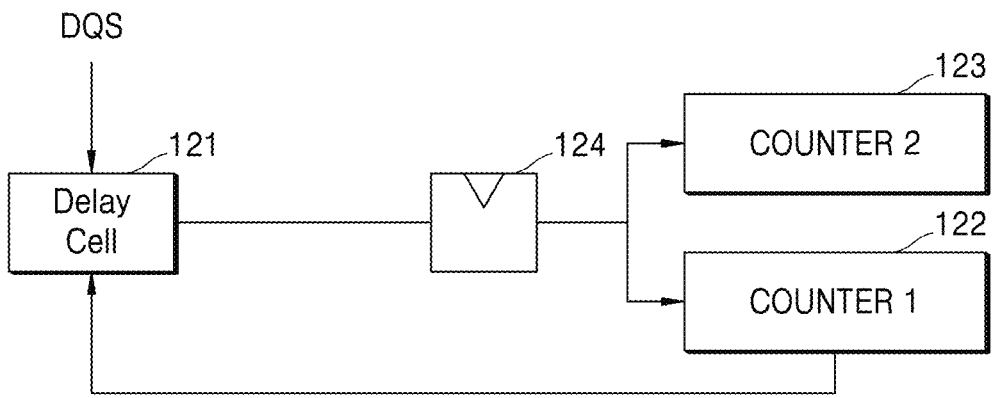
FIG. 4 is a circuit diagram of an example of a correction circuit according to some implementations.

FIG. 4 is a circuit diagram of an example of a correction circuit 120 according to some implementations. In FIG. 4, the correction circuit 120 may include a delay cell 121, a first counter 122, a second counter 123, and a second logic circuit 124.

When the write training operation is performed on the main circuit 130, the delay cell 121 may generate the reference delay Ref_D for the data strobe signal DQS received by the main circuit 130 and may store the generated reference delay Ref_D. For example, the delay cell 121 may determine the delay occurring in the data strobe signal DQS during the write training operation as the reference delay Ref_D. The delay cell 121 may include a current mode logic circuit CML or a CMOS transistor receiving a voltage of the internal power source. A configuration of the delay cell 121 will be described in detail with reference to FIGS. 5A and 5B.

The first counter 122 may adjust the reference delay Ref_D generated by the delay cell 121. For example, the first counter 122 may determine the delay of the data strobe signal DQS generated during the write training operation and may adjust the reference delay Ref_D by varying a resistance value of the delay cell 121.

When the main circuit 130 is activated, the second counter 123 may determine the delay occurring in the data strobe signal DQS received when performing the write operation. For example, the second counter 123 may determine the delay of the data strobe signal DQS received by the main circuit 130 when performing the write operation, and the memory device 100 may perform correction to equalize the reference delay Ref_D and the delay of the data strobe signal DQS received by the main circuit 130.

Figure 5A:
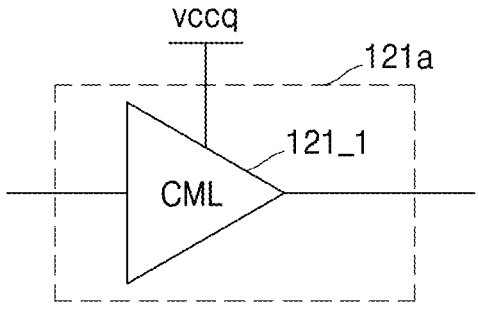
FIGS. 5A and 5B illustrate an exemplary configuration of a correction circuit according to some implementations.
Figure 5B:
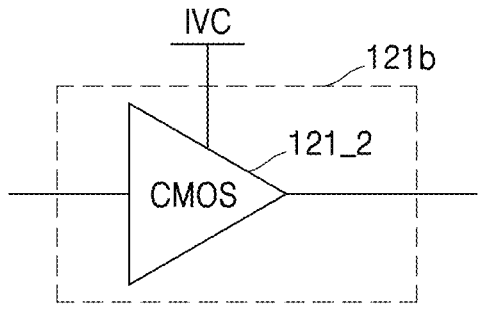

FIGS. 5A and 5B illustrate a configuration of an example of a correction circuit 120 according to some implementations. In FIGS. 5A and 5B, a delay cell of the correction circuit 120 may include a current mode logic circuit or a CMOS transistor receiving a voltage of an internal power source. A delay cell 121a, as shown in FIG. 5A, includes the current mode logic circuit, and a delay cell 121b, as shown in FIG. 5B, includes the CMOS transistor receiving the voltage of the internal power source.

In FIG. 5A, the delay cell 121a may include the current mode logic circuit 121_1, and may be operated by an external power source vccq. When the delay cell 121a includes the current mode logic circuit 121_1 driven by the external power source vccq, an error in the data strobe signal DQS generated by the voltage of the internal power source may be reduced. For example, because the delay cell 121a is not affected by an internal voltage change, the delay of the data strobe signal DQS may be accurately grasped, and the delay of the data strobe signal DQS determined when performing the write training operation may be determined as the reference delay.

In FIG. 5B, the delay cell 121b may include the CMOS transistor 121_2, and may be operated by the internal power source IVC. When the delay cell 121b includes the CMOS transistor 121_2 driven by the internal power source IVC, the error in the data strobe signal DQS generated by the voltage of the internal power source IVC may be reduced. For example, the delay cell 121b may accurately grasp the delay of the data strobe signal DQS due to characteristics of the CMOS transistor that is not affected by the internal voltage change, and may determine the delay of the data strobe signal DQS determined when performing the write training operation as the reference delay.

Figure 6:
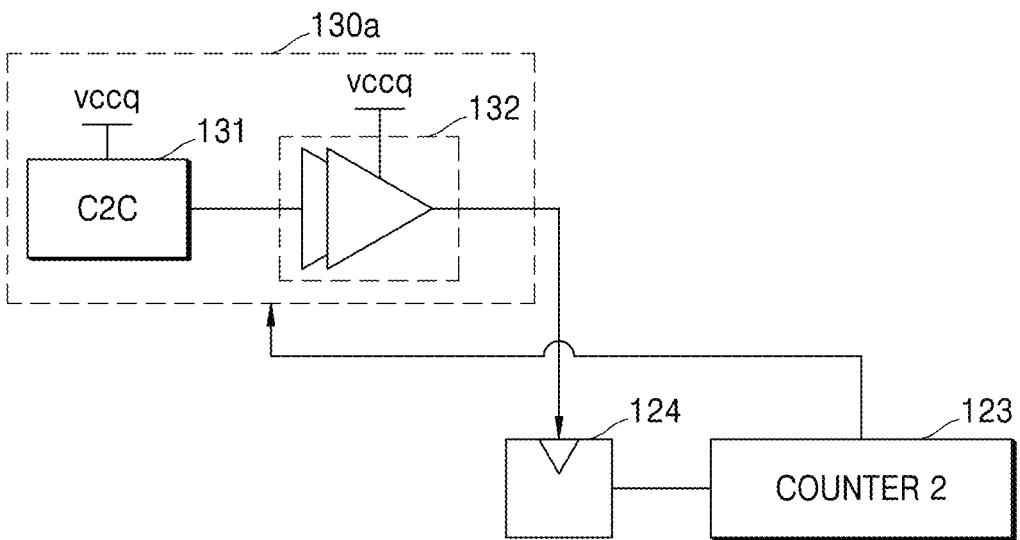
FIG. 6 is a circuit diagram of an example of a main circuit according to some implementations.

FIG. 6 is a circuit diagram of an example of a main circuit 130 according to some implementations. In FIG. 6, the main circuit 130 may include a current mode logic-CMOS level converter 131 and a delay corrector 132, and may be connected to the second counter 123 and the second logic circuit 124. The current mode logic-CMOS level converter 131 and the delay corrector 132 may constitute a main circuit delay cell 130a.

The current mode logic-CMOS level converter 131 may receive power from the external power source vccq. For example, the current mode logic-CMOS level converter 131 may receive power from the outside and may receive the reference delay Ref_D from the second counter 123. The current mode logic-CMOS level converter 131 may compare the delay of the data strobe signal DQS received during the write operation with the reference delay Ref_D. Because the current mode logic-CMOS level converter 131 receives power from the external power source, the main circuit 130 may have robustness against the internal voltage change.

The delay corrector 132 may receive power from the external power source vccq. For example, the delay corrector 132 may receive power from the outside, may compare the reference delay Ref_D with the data strobe signal DQS, and may perform correction to match the data strobe signal DQS to the reference delay Ref_D. Because the delay corrector 132 receives power from the external power source, the main circuit 130 may have robustness against the internal voltage change.

The current mode logic-CMOS level converter 131 and the delay corrector 132 may constitute a main circuit delay cell 130a. The current mode logic-CMOS level converter 131 and the delay corrector 132 may correct the delay of the data strobe signal DQS when performing the write operation, and may transmit the data strobe signal of which delay is corrected to the correction circuit 120 of FIGS. 2, 3, and 4. For example, the delay corrector 132 may transmit the corrected data strobe signal to the second logic circuit 124, and the second logic circuit 124 may transmit the delay of the corrected data strobe signal to the second counter 123. The second counter 123 may determine whether the delay of the corrected data strobe signal matches the reference delay Ref_D.

Figure 7:
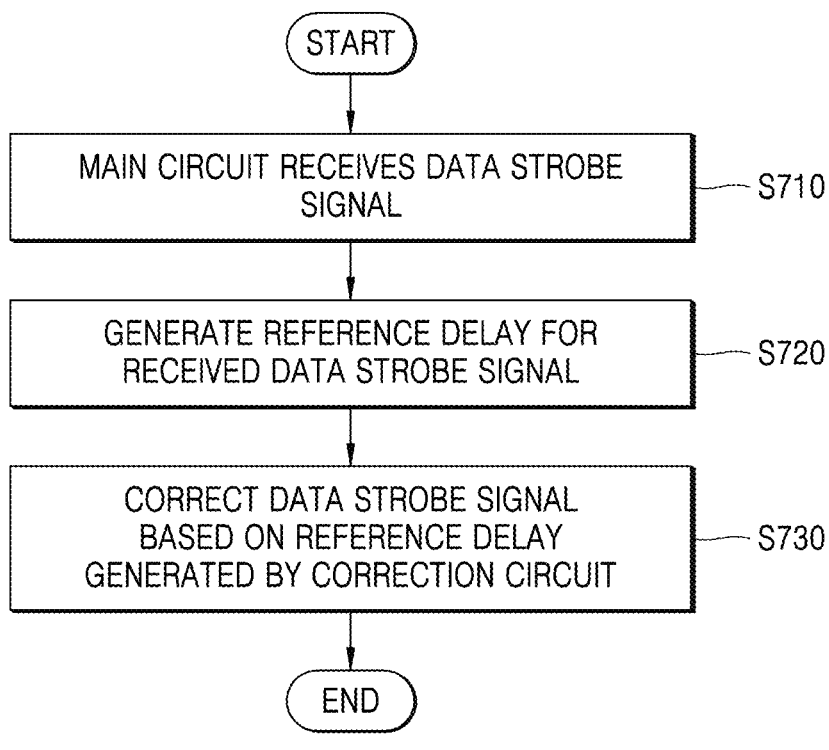
FIG. 7 is a flowchart of an example of a method of operating a memory device according to some implementations.

FIG. 7 is a flowchart of an example of a method of operating a memory device according to some implementations. In FIGS. 2 and 7, the main circuit 130 of the memory device 100 may receive the data strobe signal DQS in operation S710.

The correction circuit 120 may receive the data strobe signal DQS and may generate the reference delay Ref_D for the received data strobe signal DQS. When the data strobe signal DQS is received, the memory device 100 may generate the reference delay Ref_D for the received data strobe signal DQS in operation S720. When the write training operation is performed, the memory device 100 may generate the reference delay Ref_D for the data strobe signal DQS and may store the generated reference delay Ref_D. For example, the memory device 100 may determine a delay occurring in the data strobe signal DQS during the write training operation as the reference delay Ref_D. When the reference delay Ref_D is generated, the memory device 100 may correct the data strobe signal DQS based on the reference delay Ref_D generated by the correction circuit 120 in operation S730.

The memory device 100 may compare the delay of the data strobe signal DQS received during the write operation with the reference delay Ref_D. The memory device 100 may receive power from the external power source vccq. For example, the memory device 100 may receive power from the outside, compare the reference delay Ref_D with the data strobe signal DQS, and perform correction to match the data strobe signal DQS with the reference delay Ref_D.

Figure 8:
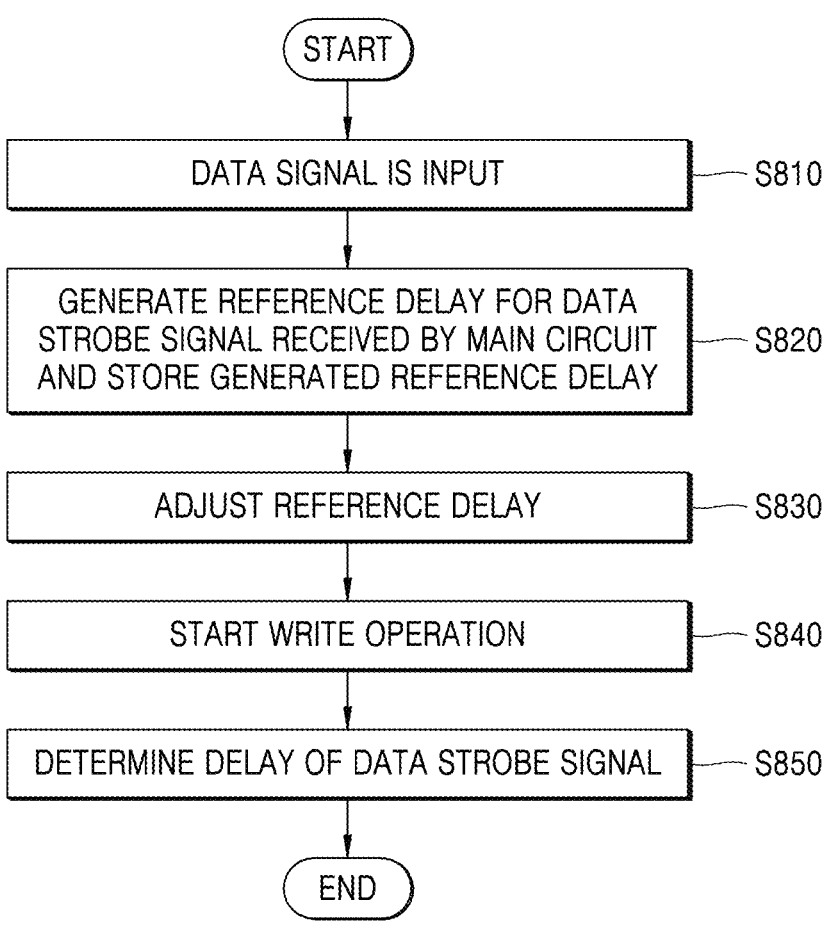
FIG. 8 is a flowchart illustrating an example of a process of performing a write training operation in a method of operating a memory device according to some implementations.

FIG. 8 is a flowchart illustrating an example of a process of performing a write training operation in a method of operating a memory device according to some implementations. In FIGS. 1, 2, and 8, the memory device 100 may start the write training operation in operation S810. The memory controller 200 may have the memory device 100 perform the write training operation before the write operation is performed by the memory device 100.

When the write training operation is performed, the memory device 100 may generate the reference delay Ref_D for the data strobe signal DQS received by the main circuit 130 and may store the generated reference delay Ref_D in operation S820.

The reference delay Ref_D may be generated by the current mode logic circuit. Alternatively, the reference delay Ref_D may be generated by the CMOS transistor receiving the voltage of the internal power source.

For example, the memory device 100 may include the current mode logic circuit, and the current mode logic circuit may be operated by the external power source. When the memory device 100 includes the current mode logic circuit driven by the external power source, an error in the data strobe signal DQS caused by the voltage of the internal power source may be reduced. For example, because the memory device 100 is not affected by the internal voltage change, the delay of the data strobe signal DQS may be accurately grasped, and the delay of the data strobe signal DQS determined when performing the write training operation may be determined as the reference delay.

In some implementations, the memory device 100 may include the CMOS transistor, and the CMOS transistor may be operated by the internal power source. When the memory device 100 includes the CMOS transistor driven by the internal power source, an error in the data strobe signal DQS caused by the voltage of the internal power source may be reduced. For example, the memory device 100 may accurately grasp the delay of the data strobe signal DQS due to characteristics of the CMOS transistor that is not affected by the internal voltage change, and may determine the delay of the data strobe signal DQS determined when performing the write training operation as the reference delay.

When the reference delay Ref_D is generated, the memory device 100 may adjust the reference delay Ref_D in operation S830. For example, the memory device 100 may adjust the generated reference delay Ref_D. For example, the memory device 100 may determine the delay of the data strobe signal DQS generated during the write training operation and may adjust the reference delay Ref_D by varying a resistance value of the memory device 100.

When the reference delay Ref_D is adjusted, the memory device 100 may start the write operation in operation S840. For example, the memory device 100 may receive the data signal DQ generated by the memory controller 200 of FIG. 1 and may perform the write operation based on the received data signal DQ.

When the write operation starts, the memory device 100 may determine the delay of the data strobe signal DQS received by the main circuit 130 in operation S850. For example, the memory device 100 may determine the delay of the data strobe signal DQS received when performing the write operation, and may perform correction to equalize the reference delay Ref_D and the delay of the received data strobe signal DQS.

Figure 9:
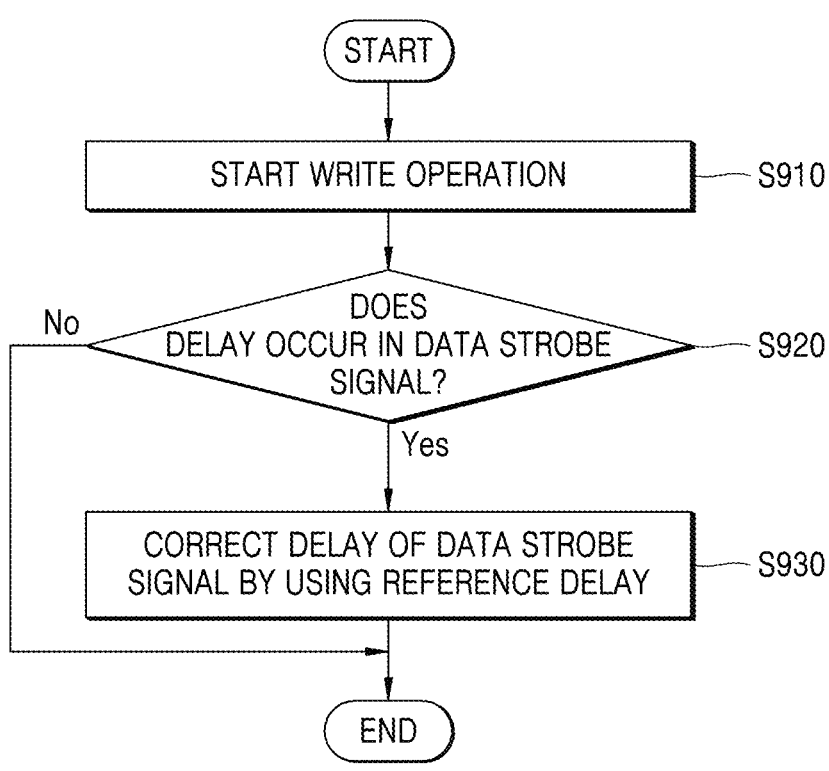
FIG. 9 is a flowchart illustrating an example of a process of correcting a delay of a data strobe signal in a method of operating a memory device according to some implementations.

FIG. 9 is a flowchart illustrating an example of a process of correcting a delay of a data strobe signal in a method of operating a memory device according to some implementations. In FIGS. 2 and 9, the memory device 100 may start the write operation in operation S910. For example, the memory device 100 may receive the data signal DQ generated by the memory controller 200 of FIG. 1 and may perform the write operation based on the received data signal DQ.

When the write operation starts, the memory device 100 may determine whether a delay occurs in the data strobe signal DQS in operation S920.

When the main circuit 130 is activated, the memory device 100 may determine a delay occurring in the data strobe signal DQS received when performing the write operation.

When it is determined that a delay occurs in the data strobe signal DQS, the memory device 100 may correct the delay of the data strobe signal DQS by using the reference delay Ref_D in operation S930. For example, the memory device 100 may determine the delay of the data strobe signal DQS received by the main circuit 130 when performing the write operation, and may perform correction to equalize the reference delay Ref_D and the delay of the data strobe signal DQS received by the main circuit 130.

The memory device 100 may have the current mode logic-CMOS level converter 131 and the delay corrector 132 of the main circuit 130 (in FIG. 6) receive external power, and may correct the delay of the data strobe signal DQS. Because the current mode logic-CMOS level converter 131 and the delay corrector 132 receive power from the external power source, the main circuit 130 may have robustness against the internal voltage change.

However, when it is determined that no delay occurs in the data strobe signal DQS, the memory device 100 perform the write operation without correcting the delay of the data strobe signal DQS.

Figure 10:
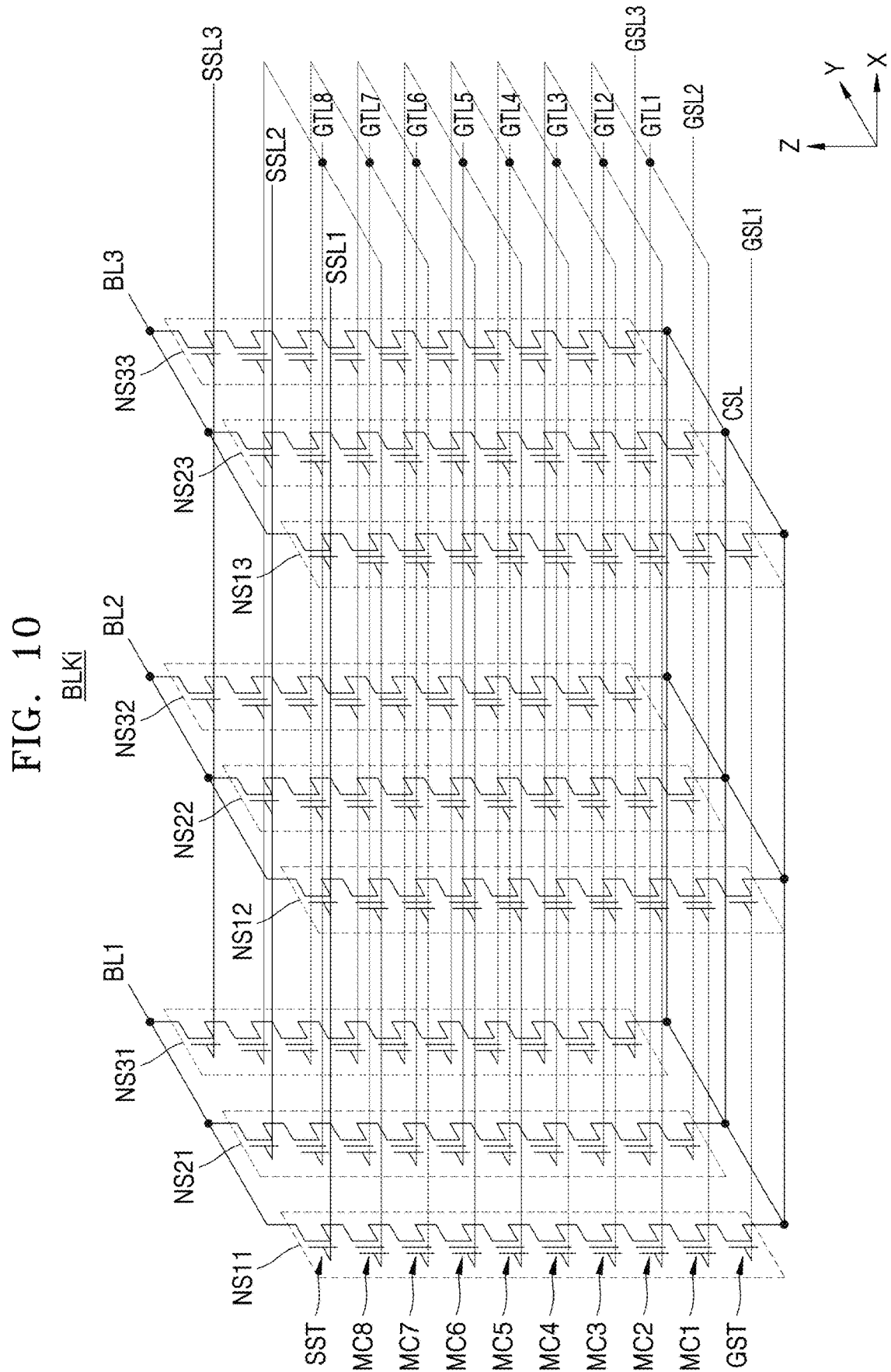
FIGS. 10 to 12 are views illustrating an example of a three-dimensional (3D) V-NAND structure that may be applied to a memory device according to some implementations.
Figure 11:
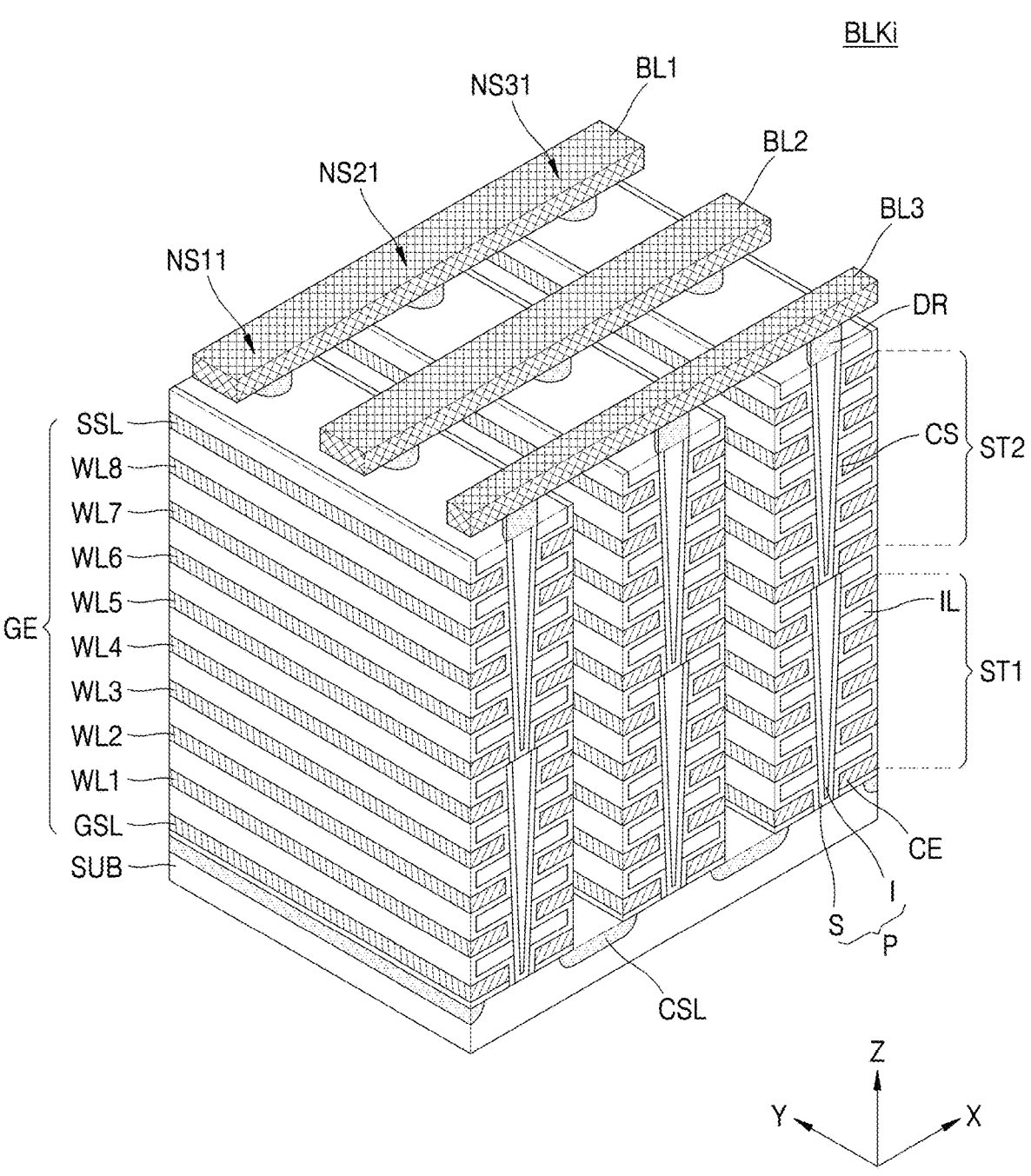
Figure 12:
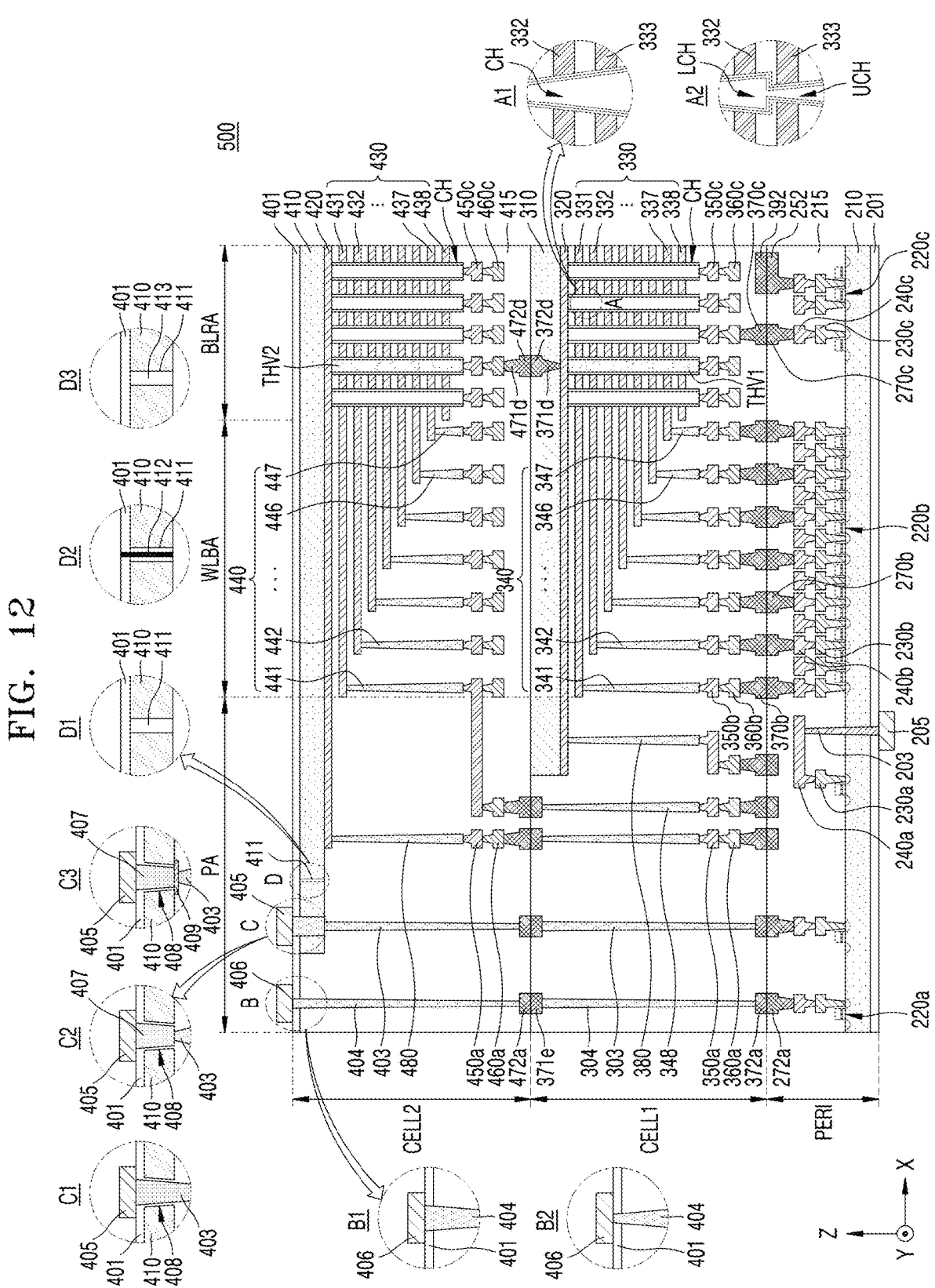

FIGS. 10 to 12 are views illustrating an example of a three-dimensional (3D) V-NAND structure that may be applied to a memory device according to some implementations. Memory applicable to the memory device 100 (in FIG. 1) may include a plurality of memory blocks. FIGS. 10 and 11 illustrate an example of a structure of one memory block BLKi among a plurality of memory blocks, and FIG. 12 illustrates an examples of an implementation of the memory device 100 (in FIG. 1).

In FIG. 10, the memory block BLKi may include a plurality of memory NAND strings NS11 to NS33 connected between bit lines BL1, BL2, and BL3 and a common source line CSL. Each of the plurality of memory NAND strings NS11 to NS33 may include a string selection transistor SST, a plurality of memory cells MC1 to MC8, and a ground selection transistor GST. For convenience, FIG. 10 depicts that each of the plurality of memory NAND strings NS11 to NS33 includes eight memory cells MC1 to MC8. However, the number of NAND strings and memory cells are not limited thereto.

The string selection transistor SST may be connected to a corresponding one of the string selection lines SSL1, SSL2, and SSL3. The plurality of memory cells MC1 to MC8 may be connected to corresponding gate lines GTL1 to GTL8, respectively. The gate lines GTL1 to GTL8 may correspond to word lines WL1 to WL8, and some of the gate lines GTL1 to GTL8 may correspond to dummy word lines. The ground selection transistor GST may be connected to a corresponding one of the ground selection lines GSL1, GSL2, and GSL3. The string selection transistor SST may be connected to the corresponding bit lines BL1, BL2, and BL3, and the ground selection transistor GST may be connected to the common source line CSL.

Gate lines (e.g., GTL1) at the same height may be commonly connected, and the ground selection lines GSL1, GSL2, and GSL3 and the string selection lines SSL1, SSL2, and SSL3 may be separated from one another. In FIG. 10, the memory block BLK is shown as being connected to the eight gate lines GTL1 to GTL8 and the three bit lines BL1, BL2, and BL3. However, the number of gate lines and bit lines are not limited thereto.

In FIG. 11, the memory block BLKi is formed in a direction perpendicular to a substrate SUB. Memory cells constituting the plurality of memory NAND strings NS11 to NS33 are stacked on a plurality of semiconductor layers.

On the substrate SUB, the common source line CSL extending in a first direction (Y direction) is provided. A plurality of insulating layers IL extending in the first direction (Y direction) are sequentially provided on a region of the substrate SUB between two adjacent common source lines CSL in a third direction (Z direction), and may be apart from one another by a specific distance in the third direction (Z direction). A plurality of pillars P are provided to pass through the plurality of insulating layers IL sequentially arranged in the first direction (Y direction) on the region of the substrate SUB between two adjacent common source lines CSL in the third direction (Z direction). The plurality of pillars P may pass through (e.g., extend into) the plurality of insulating layers IL to contact the substrate SUB. A surface layer S of each pillar P may include a silicon material doped with a first conductivity type and may function as a channel region.

An internal layer I of each pillar P may include an insulating material, such as silicon oxide or an air gap. In the region between two adjacent common source lines CSL, a charge storage layer CS is provided along exposed surfaces of the plurality of insulating layers IL, the plurality of pillars P, and the substrates SUB. The charge storage layer CS may include a gate insulating layer (or referred to as a 'tunneling insulating layer'), a charge trap layer, and a blocking insulating layer. In addition, in the region between two adjacent common source lines CSL, gate electrodes GE such as the selection lines GSL and SSL and the word lines WL1 to WL8 are provided on an exposed surface of the charge storage layer CS. Drains or drain contacts DR may be provided on the plurality of pillars P, respectively. The bit lines BL1 to BL3 extending in the second direction (X direction) and apart from one another by a specific distance in the first direction (Y direction) may be provided on the drain contacts DR.

In FIG. 10, each of the memory NAND strings NS11 to NS33 may be implemented in a structure in which a first memory stack ST1 and a second memory stack ST2 are stacked. The first memory stack ST1 is connected to the common source line CSL, the second memory stack ST2 is connected to the bit lines BL1 to BL3, and the first memory stack ST1 and the second memory stack ST2 are stacked to share a channel hole with each other.

FIG. 12 is a view illustrating an example of a memory device 500 according to some implementations. In FIG. 12, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may include a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. In some implementations, the bonding metal patterns may be formed of aluminum (Al) or tungsten (W).

The memory device 500 may include the at least one upper chip including the cell region. For example, as shown in FIG. 12, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. For example, an upper portion of the lower chip may mean an upper portion defined based on a +Z-axis direction, and the upper portion of each of the first and second upper chips may mean an upper portion defined based on a −Z-axis direction in FIG. 12. However, such configurations are not limited thereto. In some implementations, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

In some implementations, the first metal lines 230a, 230b and 230c and the second metal lines 240a, 240b and 240c may include at least one or more additional metal lines formed on the second metal lines 240a, 240b and 240c. For example, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

In FIG. 12, the interlayer insulating layer 215 may be disposed on the first substrate 210 and may include an insulating material, such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some implementations, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some implementations, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 may include a channel having improved width uniformity due to the lower channel LCH and the upper channel UCH which are formed by the processes performed sequentially.

In the case in which the channel structure CH includes the lower channel LCH and the upper channel UCH, as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. Accordingly, data may not be stored in memory cells connected to the dummy word line. In some implementations, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

In some implementations, the number of the lower word lines 331 and 332 penetrated by the lower channel LCH is less than the number of the upper word lines 333 to 338 penetrated by the upper channel UCH in the region 'A2'. However, this configuration is not limited thereto. In some implementations, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As shown in FIG. 12, the first through-electrode THV1 may penetrate (extend into) the common source line 320 and the plurality of word lines 330. In some implementations, the first through-electrode THV1 may further penetrate (extend into) the second substrate 310. The first through-electrode THV1 may include a conductive material. In some implementations, the first through-electrode THV1 may include a conductive material surrounded by an insulating material. The second through-electrode THV2 may have the same shape and structure as the first through-electrode THV1.

In some implementations, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may constitute the page buffer, and the bit line 360c may be electrically connected to the circuit elements 220c constituting the page buffer through an upper bonding metal pattern 370c of the first cell region CELL1 and an upper bonding metal pattern 270c of the peripheral circuit region PERI.

In FIG. 12, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

In some implementations, the cell contact plugs 340 may be electrically connected to a row decoder included in the peripheral circuit region PERI. For example, some of the circuit elements 220b of the peripheral circuit region PERI may constitute the row decoder, and the cell contact plugs 340 may be electrically connected to the circuit elements 220b constituting the row decoder through the upper bonding metal patterns 370b of the first cell region CELL1 and the upper bonding metal patterns 270b of the peripheral circuit region PERI. In some implementations, an operating voltage of the circuit elements 220b constituting the row decoder may be different from an operating voltage of the circuit elements 220c constituting the page buffer. For example, the operating voltage of the circuit elements 220c constituting the page buffer may be greater than the operating voltage of the circuit elements 220b constituting the row decoder.

In the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b and the upper bonding metal patterns 270b may be formed of aluminum, copper, or tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. An upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material, such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405 and 406 may be disposed in the external pad bonding region PA. In FIG. 12, a lower insulating layer 201 may cover a bottom surface of the first substrate 210, and a first input/output pad 205 may be formed on the lower insulating layer 201. The first input/output pad 205 may be connected to at least one of a plurality of the circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some implementations, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. Accordingly, the third input/output contact plug 404 may be formed by at least one of various processes.

In some implementations, as illustrated in a region 'B1', the third input/output contact plug 404 may extend in a third direction (e.g., the Z-axis direction), and a diameter of the third input/output contact plug 404 may become progressively greater toward the upper insulating layer 401. For example, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some implementations, as illustrated in a region 'B2', the third input/output contact plug 404 may extend in the third direction (e.g., the Z-axis direction), and a diameter of the third input/output contact plug 404 may become progressively less toward the upper insulating layer 401. For example, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In some implementations, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. Accordingly, a connection structure of the second input/output contact plug 403 and the second input/output pad 405 may be realized by various methods.

In some implementations, as illustrated in a region 'C1', an opening 408 may be formed to penetrate the third substrate 410, and the second input/output contact plug 403 may be connected directly to the second input/output pad 405 through the opening 408 formed in the third substrate 410. Accordingly, as illustrated in the region 'C1', a diameter of the second input/output contact plug 403 may become progressively greater toward the second input/output pad 405. However, such configurations are not limited thereto, and in some implementations, the diameter of the second input/output contact plug 403 may become progressively less toward the second input/output pad 405.

In some implementations, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Accordingly, the second input/output contact plug 403 may be electrically connected to the second input/output pad 405 through the contact 407 in the opening 408. Additionally, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some implementations, as illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. In some implementations, the stopper 409 may be a metal line formed in the same layer as at least one of the word lines 430. The second input/output contact plug 403 may be electrically connected to the second input/output pad 405 through the contact 407 and the stopper 409.

In FIG. 12, similar to the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

In some implementations, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. In some implementations, the second input/output pad 405 may be located between the slit 411 and the cell contact plugs 440 when viewed in a plan view.

In some implementations, as illustrated in a region 'D1', the slit 411 may be formed to penetrate the third substrate 410. For example, the slit 411 may be used to prevent the third substrate 410 from being finely cracked when the opening 408 is formed. However, such configurations are not limited thereto, and in some implementations, the slit 411 may be formed to have a depth ranging from about 60% to about 70% of a thickness of the third substrate 410.

In some implementations, as illustrated in a region 'D2', a conductive material 412 may be formed in the slit 411. For example, the conductive material 412 may be used to discharge a leakage current occurring in driving of the circuit elements in the external pad bonding region PA to the outside. Accordingly, the conductive material 412 may be connected to an external ground line.

In some implementations, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

In some implementations, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some implementations, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A memory device comprising:
   a correction circuit configured to receive a data strobe signal and to generate a reference delay for the received data strobe signal; and
   a main circuit configured to correct the data strobe signal based on the reference delay generated by the correction circuit,
   wherein the correction circuit comprises:
      a delay cell configured, based on a data signal being input to the main circuit, to generate a reference delay for the data strobe signal received by the main circuit and to store the generated reference delay;
      a first counter configured to adjust the reference delay; and a second counter configured, based on a write operation being performed, to determine a delay of the data strobe signal received by the main circuit.

2. The memory device of claim 1, wherein the delay cell comprises a current mode logic circuit.

3. The memory device of claim 1, wherein the delay cell comprises a complementary metal oxide semiconductor (CMOS) transistor configured to receive a voltage from an internal power source.

4. The memory device of claim 1, wherein the main circuit comprises:

a delay corrector; and a current mode logic-complementary metal oxide semiconductor (logic-CMOS) level converter.

5. The memory device of claim 4, wherein the delay corrector is configured to receive power from an external power source.

6. The memory device of claim 4, wherein the current mode logic-CMOS level converter is configured to receive power from an external power source.

7. The memory device of claim 4, wherein the main circuit comprises a data strobe signal corrector configured to receive a data strobe signal, and wherein the data strobe signal corrector comprises a plurality of stacked inverters.

8. The memory device of claim 1, wherein the main circuit is configured, based on determining that a delay occurs in the data strobe signal, to correct the delay of the data strobe signal by using the reference delay.

9. A method of operating a memory device, the method comprising:

receiving, by a correction circuit, a data strobe signal;

generating, by the correction circuit, a reference delay for the received data strobe signal; and correcting, by the correction circuit, the data strobe signal based on the reference delay generated by a main circuit, wherein the generating of the reference delay for the received data strobe signal further comprises:

generating, based on a data signal being input to the main circuit, a reference delay for the data strobe signal received by the main circuit and storing the generated reference delay;

adjusting the reference delay; and determining, based on a write operation being performed, a delay of a data strobe signal received by a main circuit.

10. The method of claim 9, wherein the storing of the reference delay further comprises storing a reference delay generated by a current mode logic circuit.

11. The method of claim 10, wherein the storing of the reference delay further comprises storing a reference delay generated by a complementary metal oxide semiconductor (CMOS) transistor configured to receive a voltage of an internal power source.

12. The method of claim 9, further comprising receiving, by a delay corrector and a current mode logic-complementary metal oxide semiconductor (logic-CMOS) level converter included in the main circuit, an external power source.

13. The method of claim 9, wherein, in the correcting of the data strobe signal based on the generated reference delay, when a delay occurs in the data strobe signal, a delay of the data strobe signal is corrected by using the reference delay.

14. A memory system comprising:

a correction circuit configured to receive a data strobe signal from a memory controller and to generate a reference delay for the received data strobe signal; and a main circuit configured to correct the data strobe signal based on the reference delay generated by the correction circuit, wherein the correction circuit comprises:

a delay cell configured, based on a write training operation being performed on the main circuit, to generate a reference delay for the data strobe signal received by the main circuit and to store the generated reference delay;

a first counter configured to adjust the reference delay; and a second counter configured, based on a write operation being performed, to determine a delay of the data strobe signal received by the main circuit, when a write operation is performed.

15. The memory system of claim 14, wherein the delay cell comprises a current mode logic circuit.

16. The memory system of claim 14, wherein the delay cell comprises a complementary metal oxide semiconductor (CMOS) transistor configured to receive a voltage from an internal power source.

17. The memory system of claim 14, wherein the main circuit comprises:

a delay corrector; and a current mode logic-complementary metal oxide semiconductor (logic-CMOS) level converter.

18. The memory system of claim 17, wherein the delay corrector and the current mode logic-CMOS level converter are configured to receive power from an external power source.

19. The memory system of claim 17, wherein the main circuit comprises a data strobe signal corrector configured to receive a data strobe signal, wherein the data strobe signal corrector comprises a plurality of stacked inverters, and wherein each of the plurality of inverters is configured to operate as a current mode logic circuit.

20. The memory system of claim 14, wherein, when a delay occurs in the data strobe signal, the correction circuit is configured to correct a delay of the data strobe signal by using the reference delay.

* * * * *